(12) United States Patent
Rokhsaz

(10) Patent No.: US 11,475,266 B2
(45) Date of Patent: *Oct. 18, 2022

(54) RECEIVED POWER LEVEL FOR RF RECEIVER CIRCUIT PROCESSING PRIORITIZATION

(71) Applicant: RFMicron, Inc., Austin, TX (US)

(72) Inventor: Shahriar Rokhsaz, Austin, TX (US)

(73) Assignee: RFMicron, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/096,139

(22) Filed: Nov. 12, 2020

(65) Prior Publication Data

US 2021/0133527 A1 May 6, 2021

Related U.S. Application Data

(60) Continuation of application No. 15/645,489, filed on Jul. 10, 2017, now Pat. No. 10,860,912, which is a continuation of application No. 14/644,471, filed on Mar. 11, 2015, now Pat. No. 9,704,085, which is a continuation of application No. 13/209,425, filed on Aug. 14, 2011, now Pat. No. 9,048,819, which is a continuation-in-part of application No. 12/462,331, (Continued)

(51) Int. Cl.
| | |
|---|---|
| *H04N 5/44* | (2011.01) |
| *G06K 19/07* | (2006.01) |
| *H03J 3/20* | (2006.01) |
| *H04B 17/318* | (2015.01) |
| *H04B 5/00* | (2006.01) |

(52) U.S. Cl.
CPC ............ *G06K 19/0726* (2013.01); *H03J 3/20* (2013.01); *H04B 5/0062* (2013.01); *H04B 17/318* (2015.01); *H03J 2200/10* (2013.01)

(58) Field of Classification Search
CPC .... G06K 19/0726; H03J 3/20; H03J 2200/10; H04B 5/0062; H04B 17/318
See application file for complete search history.

(56) References Cited

U.S. PATENT DOCUMENTS 6,600,418 B2 * 7/2003 Francis .................. G06K 17/00
700/229
7,446,662 B1 * 11/2008 Somogyi ............ G08B 13/2485
340/10.41

(Continued)

*Primary Examiner* — Munear T Akki
(74) *Attorney, Agent, or Firm* — Garlick & Markison; Timothy W. Markison; Patricia M. Healy

(57) ABSTRACT

A method includes transmitting, by a radio frequency identification (RFID) reader, a series of RF signals to a plurality of RF receiver circuits in a time sequence. The first RF signal commands the plurality of RF receiver circuits to remain silent when received signal strength of the first RF signal corresponds to a power level greater than a first power level. The method further includes receiving one or more sets of responses from one or more sets of RF receiver circuits of the plurality of RF receiver circuits in response to the series of RF signals. The method further includes determining an area of interest based on the one or more sets of responses, determining a set of power levels corresponding to the area of interest, and transmitting a second series of RF signals to the plurality of RF receiver circuits in a second time sequence.

13 Claims, 4 Drawing Sheets

Related U.S. Application Data filed on Aug. 1, 2009, now Pat. No. 8,081,043, which is a division of application No. 11/601,085, filed on Nov. 18, 2006, now Pat. No. 7,586,385.

(60) Provisional application No. 61/485,732, filed on May 13, 2011, provisional application No. 61/428,170, filed on Dec. 29, 2010.

(56) References Cited

U.S. PATENT DOCUMENTS

| | | | | |
|---|---|---|---|---|
| 8,044,804 B1* | 10/2011 | McReynolds | | G01S 13/04 340/8.1 |
| 8,552,841 B2* | 10/2013 | Raggam | | H04B 5/0062 340/10.5 |
| 8,952,788 B1* | 2/2015 | Dacus | | G06K 19/0715 340/10.2 |
| 2004/0036575 A1* | 2/2004 | Patterson | | G06K 7/0008 340/10.2 |
| 2005/0285742 A1* | 12/2005 | Charych | | G06K 17/00 340/572.1 |
| 2006/0132351 A1* | 6/2006 | Le Sesne | | G01F 23/2845 342/124 |
| 2006/0176152 A1* | 8/2006 | Wagner | | G06K 7/0008 340/10.2 |
| 2007/0018793 A1* | 1/2007 | Stewart | | G06K 7/10356 340/10.2 |
| 2007/0072565 A1* | 3/2007 | Yach | | H04W 52/0261 455/574 |
| 2007/0247286 A1* | 10/2007 | Drago | | G06K 19/07749 340/10.5 |
| 2007/0273481 A1* | 11/2007 | Soleimani | | H01Q 1/2225 340/10.33 |
| 2007/0290802 A1* | 12/2007 | Batra | | G06K 7/0008 340/572.1 |
| 2008/0100439 A1* | 5/2008 | Rinkes | | G06K 7/0008 340/8.1 |
| 2010/0240318 A1* | 9/2010 | Tomoeda | | G06K 7/10297 455/558 |
| 2010/0271186 A1* | 10/2010 | Tanaka | | G01S 11/06 340/10.3 |
| 2013/0154801 A1* | 6/2013 | O'Haire | | G06K 7/10118 340/10.1 |
| 2015/0054624 A1* | 2/2015 | Busch-Sorensen | | G06K 7/10217 340/10.1 |

* cited by examiner

RECEIVED POWER LEVEL FOR RF RECEIVER CIRCUIT PROCESSING PRIORITIZATION

CROSS-REFERENCE TO RELATED APPLICATIONS

The present U.S. Utility Patent Application claims priority pursuant to 35 U.S.C. § 120 as a continuation of U.S. Utility application Ser. No. 15/645,489, entitled, "Received Power Level for Tag Processing Prioritization", filed on Jul. 10, 2017, which claims priority pursuant to 35 U.S.C. § 120 as a continuation of U.S. Utility application Ser. No. 14/644, 471, entitled, "Method and Apparatus for Detecting RF Field Strength", filed on Mar. 11, 2015, now U.S. Pat. No. 9,704,085, issued Jul. 11, 2017, which claims priority pursuant to 35 U.S.C. § 120 as a continuation of U.S. Utility application Ser. No. 13/209,425, entitled "Method and Apparatus for Detecting RF Field Strength", filed Aug. 14, 2011, now U.S. Pat. No. 9,048,819, issued Jun. 2, 2015, which is a Continuation-In-Part of application Ser. No. 12/462,331, filed Aug. 1, 2009, now U.S. Pat. No. 8,081, 043, issued Dec. 20, 2011 ("Related Application"), which is in turn a Division of application Ser. No. 11/601,085, filed Nov. 18, 2006, now U.S. Pat. No. 7,586,385, issued Sep. 8, 2009 ("Related Patent") (collectively, "Related References"). U.S. Utility application Ser. No. 13/209,425 also claims priority pursuant to 35 U.S.C. § 119(e) to U.S. Provisional Application No. 61/428,170, filed Dec. 29, 2010, and U.S. Provisional Application No. 61/485,732, filed May 13, 2011. The subject matter of the Related References and Related Applications, each in its entirety, is expressly incorporated herein by reference.

BACKGROUND OF THE INVENTION

1. Field of the Invention

The present invention relates generally to detecting RF field strength, and, in particular, to detecting RF field strength in a passive RFID system.

2. Description of the Related Art

In general, in the descriptions that follow, we will italicize the first occurrence of each special term of art that should be familiar to those skilled in the art of radio frequency ("RF") communication systems. In addition, when we first introduce a term that we believe to be new or that we will use in a context that we believe to be new, we will bold the term and provide the definition that we intend to apply to that term. In addition, throughout this description, we will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, we may refer to the mutually exclusive Boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

In accordance with our prior invention previously disclosed in the Related References, the amplitude modulated ("AM") signal broadcast by the reader in an RFID system will be electromagnetically coupled to a conventional antenna, and a portion of the current induced in a tank circuit is extracted by a regulator to provide operating power for all other circuits. Once sufficient stable power is available, the regulator will produce, e.g., a power-on-reset signal to initiate system operation. Thereafter, the method disclosed in the Related References, and the associated apparatus, dynamically varies the capacitance of a variable capacitor component of the tank circuit so as to dynamically shift the $f_R$ of the tank circuit to better match the $f_C$ of the received RF signal, thus obtaining maximum power transfer in the system.

In general, the invention disclosed in the Related References focused primarily on quantizing the voltage developed by the tank circuit as the primary means of matching the $f_R$ of the tank circuit to the transmission frequency, $f_C$, of the received signal. However, this voltage quantization is, at best, indirectly related to received signal field strength. We submit that what is needed now is an effective and efficient method and apparatus for quantizing the received field strength as a function of induced current. It is further desirable to develop this field quantization in a form and manner that is suitable for selectively varying the input impedance of the receiver circuit to maximize received power, especially during normal system operation. Additionally, in light of the power sensitive nature of RFID systems, it is desirable to vary the input impedance with a minimum power loss.

BRIEF SUMMARY OF THE INVENTION

In accordance with the preferred embodiment of our invention, we provide a sensing system for use in an RFID system. In general, the sensing system comprises an RFID tag and an RFID reader. In one embodiment, the RFID tag comprises a tank circuit having a selectively variable impedance; and a tuning circuit adapted to dynamically vary the impedance of the tank circuit, and to develop a first quantized value representative of the impedance of said tank circuit. In one alternate embodiment, the RFID tag comprises a detector circuit adapted to develop a second quantized value as a function of a field strength of a received RF signal. In yet another embodiment, the RFID tag comprises both the tank and tuning circuit, and the detector circuit. In these embodiments, RFID reader is adapted selectively to retrieve one or both of the first and second values, and, preferably, to use the retrieved values to sense changes to an environment to which the RFID tag is exposed

BRIEF DESCRIPTION OF THE SEVERAL VIEWS OF THE DRAWINGS

My invention may be more fully understood by a description of certain preferred embodiments in conjunction with the attached drawings in which.

Figure 1:
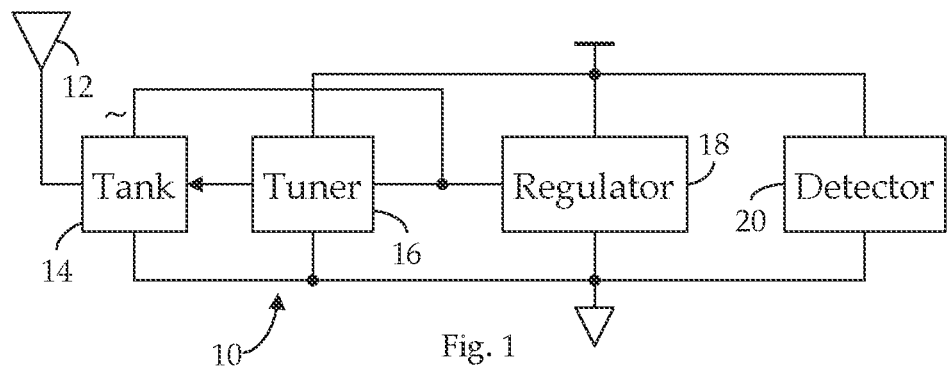
FIG. 1 illustrates, in block diagram form, an RF receiver circuit having a field strength detector constructed in accordance with an embodiment of our invention.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

Shown in FIG. 1 is an RF receiver circuit 10 suitable for use in an RFID application. As we have described in our Related References, an RF signal electromagnetically coupled to an antenna 12 is received via a tank circuit 14, the response frequency, $f_R$, of which is dynamically varied by a tuner 16 to better match the transmission frequency, $f_C$, of the received RF signal, thus obtaining a maximum power transfer. In particular, as further noted in the Related Applications, the RMS voltage induced across the tank circuit 14 by the received RF signal is quantized by tuner 16 and the developed quantization employed to control the impedance of the tank circuit 14. As also described in the Related References, the unregulated, AC current induced in the tank circuit 14 by the received RF signal is conditioned by a regulator 18 to provide regulated DC operating power to the receiver circuit 10. In accordance with our present invention, we now provide a field strength detector 20, also known as a power detector, adapted to develop a field-strength value as a function of the field strength of the received RF signal. As we have indicated in FIG. 1, our field strength detector 20 is adapted to cooperate with the regulator 18 in the development of the field-strength value. As we shall disclose below, if desired, our field strength detector 20 can be adapted to cooperate with the tuner 16 in controlling the operating characteristics of the tank circuit 14.

Figure 2:
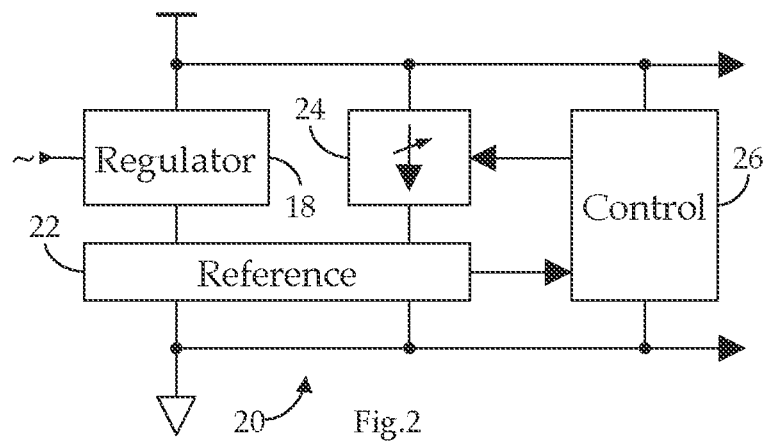
FIG. 2 illustrates, in block diagram form, a field strength detector circuit constructed in accordance with an embodiment of our invention.

Shown by way of example in FIG. 2 is one possible embodiment of our field strength or power detector 20. In this embodiment, we have chosen to employ a shunt-type regulator 18 so that, during normal operation, we can use the shunted 'excess' current as a reference against which we develop the field-strength value. In this regard, we use a reference 22 first to develop a shunt current reference value proportional to the shunted current, and then to develop a mirrored current reference value as a function of both the shunted current and a field strength reference current provided by a digitally-controlled current source 24. Preferably, once the tuner 16 has completed its initial operating sequence, whereby the $f_R$ of the tank circuit 14 has been substantially matched to the $f_C$ of the received signal, we then enable a digital control 26 to initiate operation of the current source 24 at a predetermined, digitally-established minimum field strength reference current. After a predetermined period of time, control 26 captures the mirrored current reference value provided by the current reference 22, compares the captured signal against a predetermined threshold value, and, if the comparison indicates that the field strength reference current is insufficient, increases, in accordance with a predetermined sequence of digital-controlled increments, the field strength reference current; upon the comparison indicating that the field strength reference current is sufficient, control 26 will, at least temporarily, cease operation.

In accordance with our invention, the digital field-strength value developed by control 26 to control the field strength current source 24 is a function of the current induced in the tank circuit 14 by the received RF signal. Once developed, this digital field-strength value can be employed in various ways. For example, it can be selectively transmitted by the RFID device (using conventional means) back to the reader (not shown) for reference purposes. Such a transaction can be either on-demand or periodic depending on system requirements. Imagine for a moment an application wherein a plurality of RFID tag devices is distributed, perhaps randomly, throughout a restricted, 3-dimensional space, e.g., a loaded pallet. Imagine also that the reader is programmed to query, at an initial field strength, all tags "in bulk" and to command all tags that have developed a field-strength value greater than a respective field-strength value to remain 'silent'. By performing a sequence of such operations, each at an increasing field strength, the reader will, ultimately, be able to isolate and distinguish those tags most deeply embedded within the space; once these 'core' tags have been read, a reverse sequence can be performed to isolate and distinguish all tags within respective, concentric 'shells' comprising the space of interest. Although, in all likelihood, these shells will not be regular in either shape or relative volume, the analogy should still be apt.

Figure 3:
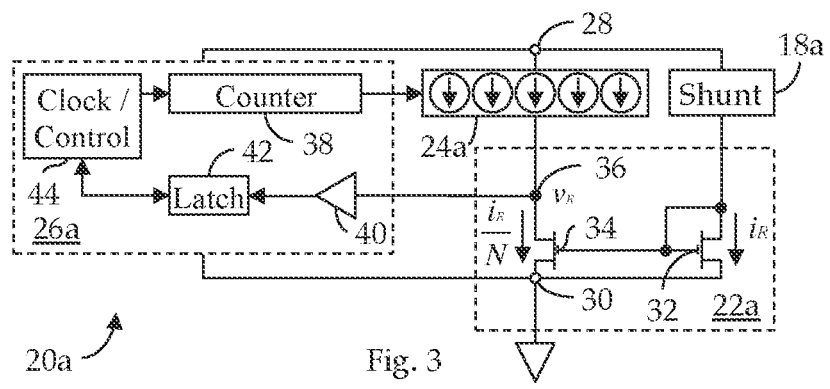
FIG. 3 illustrates, in block schematic form, a more detailed embodiment of the field strength detector circuit shown in FIG. 2.

In FIG. 3, we have illustrated one possible embodiment of our field strength detector 20a. In general, we have chosen to use a shunt circuit 18a to develop a substantially constant operating voltage level across supply node 28 and ground node 30. Shunt regulators of this type are well known in the art, and typically use Zener diodes, avalanche breakdown diodes, diode-connected MOS devices, and the like.

As can be seen, we have chosen to implement current reference 22 in the form of a current mirror circuit 22a, connected in series with shunt circuit 18a between nodes 28 and 30. As is typical, current mirror circuit 22a comprises a diode-connected reference transistor 32 and a mirror transistor 34. If desired, a more sophisticated circuit such as a Widlar current source may be used rather than this basic two-transistor configuration. For convenience of reference, we have designated the current shunted by shunt circuit 18a via reference transistor 32 as $i_R$; similarly, we have designated the current flowing through mirror transistor 34 as $i_R/N$, wherein, as is known, N is the ratio of the widths of reference transistor 32 and mirror transistor 34.

We have chosen to implement the field strength current source 24 as a set of n individual current sources 24a, each connected in parallel between the supply node 28 and the mirror transistor 34. In general, field strength current source 24a is adapted to source current at a level corresponding to an n-bit digital control value developed by a counter 38. In the illustrated embodiment, wherein n=5, field strength current source 24a is potentially capable of sourcing thirty-two distinct reference current levels. We propose that the initial, minimum reference current level be selected so as to be less than the current carrying capacity of the mirror transistor 34 when the shunt circuit 18a first begins to shunt excess induced current through reference transistor 32; that the maximum reference current level be selected so as to be greater than the current carrying capacity of the mirror transistor 34 when the shunt circuit 18a is shunting a maximum anticipated amount of excess induced current; and that the intermediate reference current levels be distributed relatively evenly between the minimum and maximum levels. Of course, alternate schemes may be practicable, and, perhaps, desirable depending on system requirements.

Within control 26a, a conventional analog-to-digital converter ("ADC") 40, having its input connected to a sensing node 36, provides a digital output indicative of the field strength reference voltage, $v_R$, developed on sensing node 36. In one embodiment, ADC 40 may comprise a comparator circuit adapted to switch from a logic_0 state to a logic_1 when sufficient current is sourced by field strength current source 24a to raise the voltage on sensing node 36 above a predetermined reference voltage threshold, $v_{th}$. Alternatively, ADC 40 may be implemented as a multi-bit ADC capable of providing higher precision regarding the specific voltage developed on sensing node 36, depending on the requirements of the system. Sufficient current may be characterized as that current sourced by the field strength current source 24a or sunk by mirror transistor 34 such that the voltage on sensing node 36 is altered substantially above or below a predetermined reference voltage threshold, $v_{th}$. In the exemplary case of a simple CMOS inverter, $v_{th}$ is, in its simplest form, one-half of the supply voltage (VDD/2). Those skilled in the art will appreciate that $v_{th}$ may by appropriately modified by altering the widths and lengths of the devices of which the inverter is comprised. In the exemplary case a multi-bit ADC, $v_{th}$ may be established by design depending on the system requirements and furthermore, may be programmable by the system.

In the illustrated embodiment, a latch 42 captures the output state of ADC 40 in response to control signals provided by a clock/control circuit 44. If the captured state is logic_0, the clock/control circuit 44 will change counter 38 to change the reference current being sourced by field strength current source 24a; otherwise clock/control circuit 44 will, at least temporarily, cease operation. However, notwithstanding, the digital field-strength value developed by counter 38 is available for any appropriate use, as discussed above.

Figure 4:
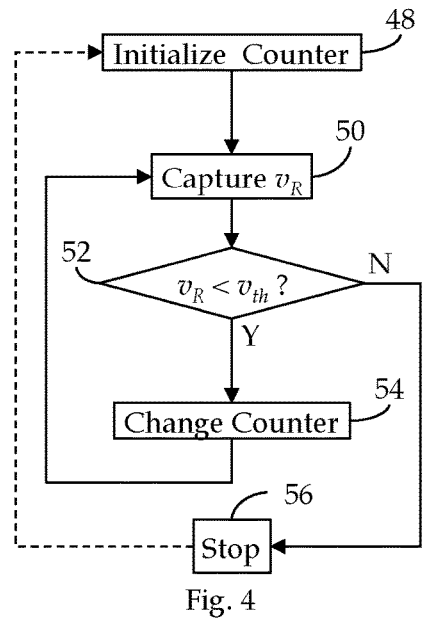
FIG. 4 illustrates, in flow diagram form, the sequencing of operations in the field strength detector circuit shown in FIG. 3.

By way of example, we have illustrated in FIG. 4 one possible general operational flow of our field strength detector 20a. Upon activation, counter 38 is set to its initial digital field-strength value (step 48), thereby enabling field strength current source 24a to initiate reference current sourcing at the selected level. After an appropriate settling time, the field strength reference voltage, $v_R$, developed on sensing node 36 and digitized by ADC 40 is captured in latch 42 (step 50). If the captured field strength reference voltage, $v_R$, is less than (or equal to) the predetermined reference threshold voltage, $v_{th}$, clock/control 44 will change counter 38 (step 54). This process will repeat, changing the reference current sourced by field strength current source 24a until the captured field strength reference voltage, $v_R$, is greater than the predetermined reference threshold voltage, $v_{th}$, (at step 52), at which time the process will stop (step 56). As illustrated, this sweep process can be selectively reactivated as required, beginning each time at either the initial field-strength value or some other selected value within the possible range of values as desired.

Figure 5:
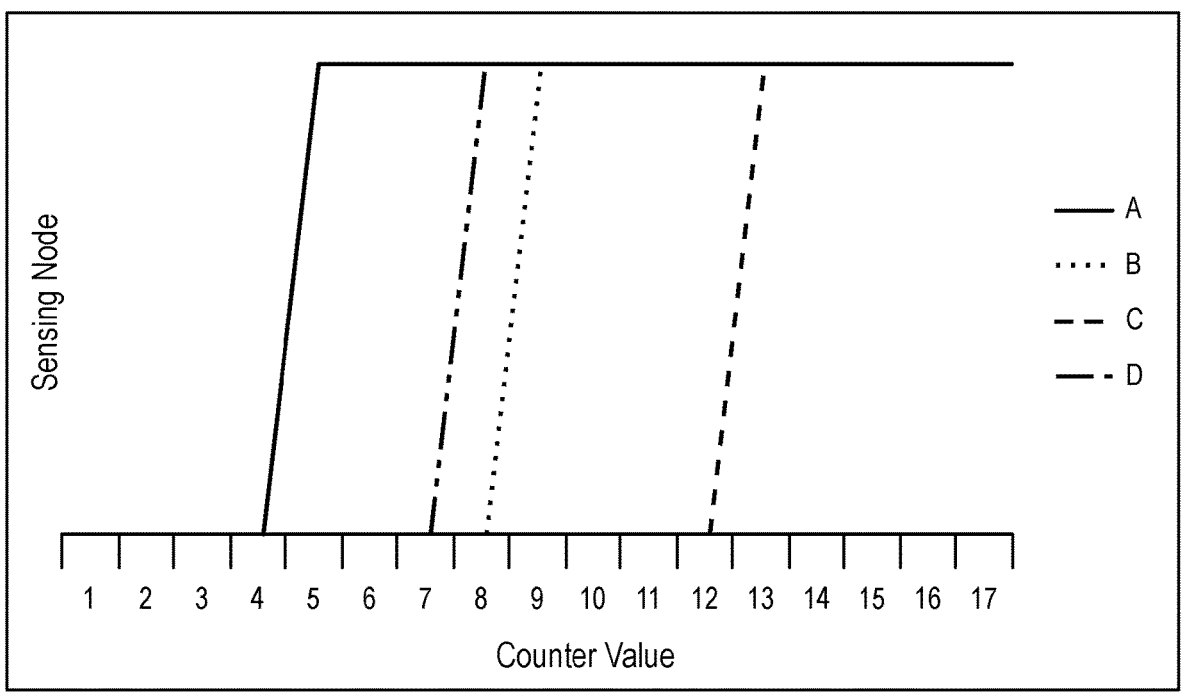
FIG. 5 illustrates, in graph form, the response of the field strength detector circuit shown in FIG. 3 to various conditions.

The graph illustrated in FIG. 5 depicts several plots of the voltage developed on sensing node 36 as the field strength detector circuit 20a sweeps the value of counter 38 according to the flow illustrated in FIG. 4. As an example, note that the curve labeled "A" in FIG. 5 begins at a logic_0 value when the value of counter 38 is at a minimum value such as "1" as an exemplary value. Subsequent loops though the sweep loop gradually increase the field strength reference voltage on sensing node 36 until counter 38 reaches a value of "4" as an example. At this point, the "A" plot in FIG. 5 switches from a logic_0 value to a logic_1 value, indicating that the field strength reference voltage, $v_R$, on sensing node 36 has exceeded the predetermined reference threshold voltage, $v_{th}$. Other curves labeled "B" through "D" depict incremental increases of reference currents, $i_R$, flowing through reference device 32, resulting in correspondingly higher mirrored currents flowing through mirror device 34. This incrementally higher mirror current requires field strength current source 24 to source a higher current level which in turn corresponds to higher values in counter 38. Thus, it is clear that our invention is adapted to effectively and efficiently develop a digital representation of the current flowing through sensing node 36 that is suitable for any appropriate use.

Figure 6:
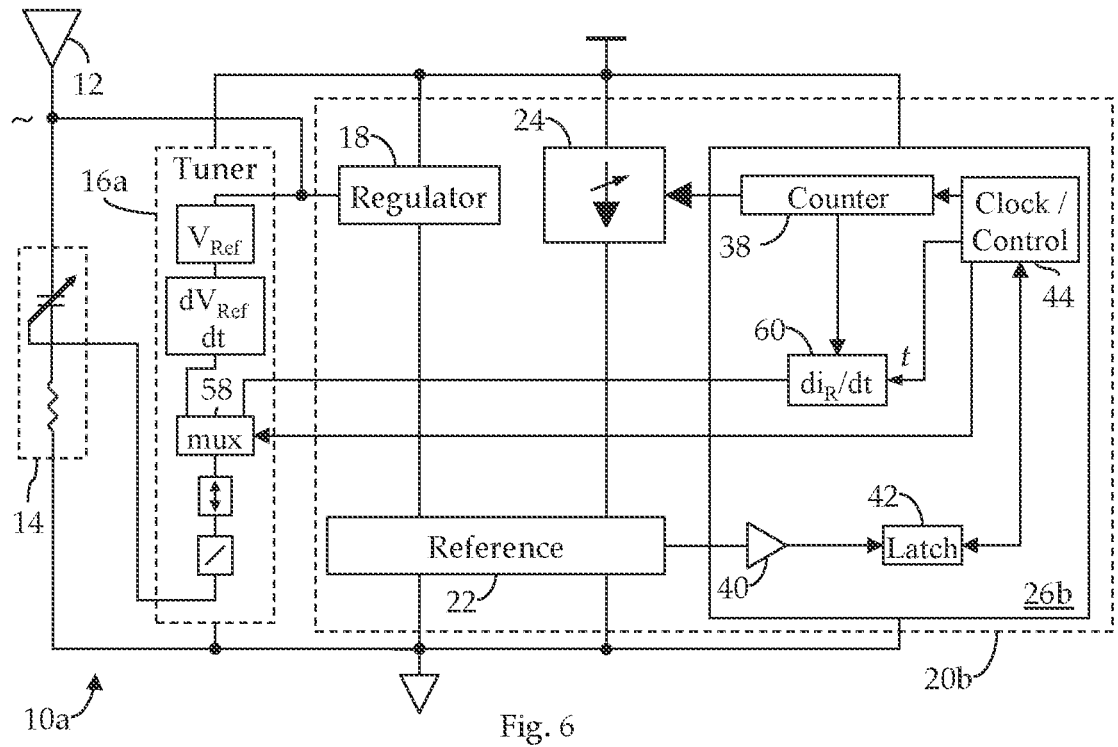
FIG. 6 illustrates, in block schematic form, an RF receiver circuit constructed in accordance with another embodiment of our invention.

One such use, as discussed earlier, of our field strength detector 20 is to cooperate with tuner 16 in controlling the operating characteristics of the tank circuit 14. FIG. 6 illustrates one possible embodiment where receiver circuit 10a uses a field strength detector 20b specially adapted to share with tuner 16a the control of the tank circuit 14. In our Related References we have disclosed methods, and related apparatus, for dynamically tuning, via tuner 16a, the tank circuit 14 so as to dynamically shift the $f_R$ of the tank circuit 14 to better match the $f_C$ of the received RF signal at antenna 12. By way of example, we have shown in FIG. 6 how the embodiment shown in FIG. 3 of our Related Patent may be easily modified by adding to tuner 16a a multiplexer 58 to facilitate shared access to the tuner control apparatus. Shown in FIG. 7 is the operational flow (similar to that illustrated in FIG. 4 in our Related Patent) of our new field strength detector 20b upon assuming control of tank circuit 14.

Figure 7:
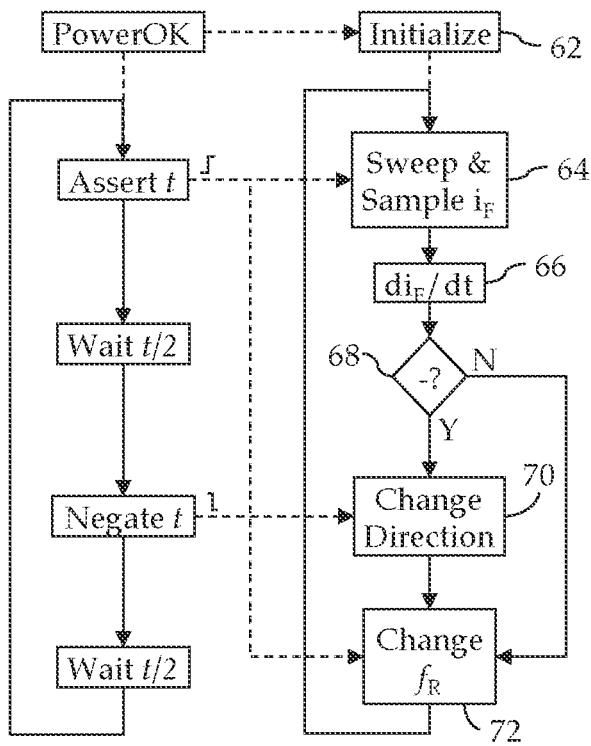
FIG. 7 illustrates, in flow diagram form, the sequencing of the operations in the RF receiver circuit shown in FIG. 6.

In context of this particular use, once tuner 16a has completed its initial operating sequences as fully described in our Related Patent, and our field strength detector 20b has performed an initial sweep (as described above and illustrated in FIG. 4) and saved in a differentiator 60 a base-line field-strength value developed in counter 38, clock/control 44 commands multiplexer 58 to transfer control of the tank circuit 16a to field strength detector 20b (all comprising step 62 in FIG. 7). Upon completing a second current sweep, differentiator 60 will save the then-current field-strength value developed in the counter 38 (step 64). Thereafter, differentiator 60 will determine the polarity of the change of the previously saved field-strength value with respect to the then-current field-strength value developed in counter 38 (step 66). If the polarity is negative (step 68), indicating that the current field-strength value is lower than the previously-saved field-strength value, differentiator 60 will assert a change direction signal; otherwise, differentiator 60 will negate the change direction signal (step 70). In response, the shared components in tuner 16a downstream of the multiplexer 58 will change the tuning characteristics of tank circuit 14 (step 72) (as fully described in our Related References). Now, looping back (to step 64), the resulting change of field strength, as quantized is the digital field-strength value developed in counter 38 during the next sweep (step 64), will be detected and, if higher, will result in a further shift in the $f_R$ of the tank circuit 14 in the selected direction or, if lower, will result in a change of direction (step 70). Accordingly, over a number of such 'seek' cycles, our invention will selectively allow the receiver 10a to maximize received field strength even if, as a result of unusual factors, the $f_R$ of the tank circuit 14 may not be precisely matched to the $f_C$ of the received RF signal, i.e., the reactance of the antenna is closely matched with the reactance of the tank circuit, thus achieving maximum power transfer. In an alternative embodiment, it would be unnecessary for tuner 16a to perform an initial operating sequence as fully described in our Related Patent. Rather, field strength detector 20b may be used exclusively to perform both the initial tuning of the receiver circuit 10a as well as the subsequent field strength detection. Note that the source impedance of antenna 12 and load impedance of tank circuit 14 may be represented alternatively in schematic form as in FIG. 8, wherein antenna 12 is represented as equivalent source resistance $R_S$ 74 and equivalent source reactance $X_S$ 76, and tank circuit 14 is represented as equivalent load resistance $R_L$ 78 and equivalent, variable load reactance $X_L$ 80.

Figure 9:
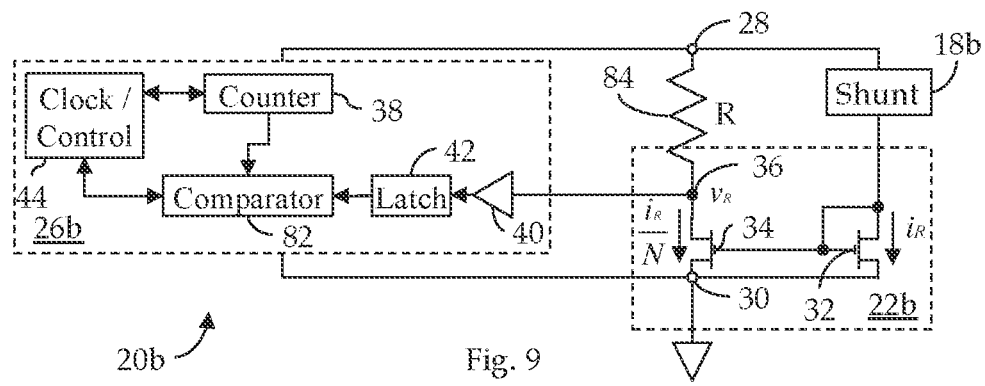
FIG. 9 illustrates, in block schematic form, an alternative exemplary embodiment of the field strength detector circuit shown in FIG. 3.

In FIG. 9, we have illustrated an alternate embodiments of our field strength detector illustrated in FIG. 3. Here, as before, shunt circuit 18b is used to develop a substantially constant operating voltage level across supply node 28 and ground node 30. Also, as before, the current reference 22 is implemented as a current mirror circuit 22b connected in series with shunt circuit 18b between nodes 28 and 30. However, in this embodiment, the field strength current source comprises a resistive component 84 adapted to function as a static resistive pull-up device. Many possible implementations exist besides a basic resistor, such as a long channel length transistor, and those skilled in the art will appreciate the various implementations that are available to accomplish analogous functionality. The field strength voltage reference $v_R$ developed on sensing node 36 will be drawn to a state near the supply voltage when the mirrored current flowing though transistor 34 is relatively small, e.g. close to zero amps, indicating a weak field strength. As the field strength increases, the current flowing through mirror transistor 34 will increase, and the field strength voltage reference $v_R$ developed on sensing node 36 will drop proportionally to the mirrored current flowing through mirror transistor 34 as $i_R/N$. ADC 40, having its input connected to sensing node 36, provides a digital output indicative of the field strength reference voltage, $v_R$, developed on sensing node 36, as described previously.

In this alternate embodiment, latch 42 captures the output state of ADC 40 in response to control signals provided by a clock/control circuit 44. As disclosed earlier, the ADC 40 may comprise a comparator circuit. In this instance, ADC 40 is adapted to switch from a logic_1 state to a logic_0 when sufficient current is sunk by mirror transistor 34 to lower the voltage on sensing node 36 below a predetermined reference voltage threshold, $v_{th}$. Alternatively, ADC 40 may be implemented as a multi-bit ADC capable of providing higher precision regarding the specific voltage developed on sensing node 36, depending on the requirements of the system.

Comparator 82 subsequently compares the captured output state held in latch 42 with a value held in counter 38 that is selectively controlled by clock/control circuit 44. In response to the output generated by comparator 82, clock/control circuit 44 may selectively change the value held in counter 38 to be one of a higher value or a lower value, depending on the algorithm employed. Depending upon the implementation of counter 38 and comparator 82, clock/control circuit 44 may also selectively reset the value of counter 38 or comparator 82 or both. The digital field-strength value developed by counter 38 is available for any appropriate use, as discussed above.

Figure 10:
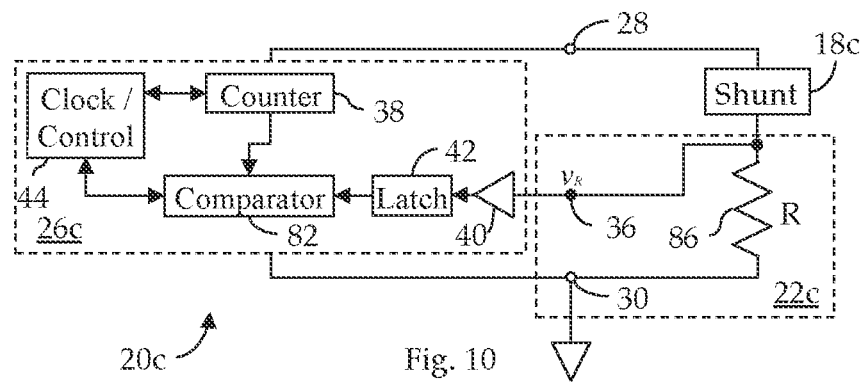
FIG. 10 illustrates, in block schematic form, an alternative exemplary embodiment of the field strength detector circuit shown in FIG. 3.

In FIG. 10, we have illustrated another alternate embodiment of our field strength detector illustrated in FIG. 3. Here, as before, shunt circuit 18c is used to develop a substantially constant operating voltage level across supply node 28 and ground node 30. In this embodiment, the current reference 22 is implemented as a resistive component 86 that functions as a static pull-down device. Many possible implementations exist besides a basic resistor, such as a long channel length transistor and those skilled in the art will appreciate the various implementations that are available to accomplish analogous functionality. The field strength voltage reference vR developed on sensing node 36 will be drawn to a state near the ground node when the current flowing though shunt circuit 18c is relatively small, e.g. close to zero amps, indicating a weak field strength. As the field strength increase, the current flowing through shunt circuit 18c will increase, and the field strength voltage reference $v_R$ developed on sensing node 36 will rise proportionally to the current flowing through shunt circuit 18c. ADC 40, having its input connected to a sensing node 36, provides a digital output indicative of the field strength reference voltage, $v_R$, developed on sensing node 36, as described previously.

In this alternate embodiment, latch 42 captures the output state of ADC 40 in response to control signals provided by a clock/control circuit 44. As disclosed earlier, the ADC 40 may comprise a comparator circuit. In this instance, ADC 40 is adapted to switch from a logic_0 state to a logic_1 when sufficient current is sourced by shunt circuit 18c to raise the voltage on sensing node 36 above a predetermined reference voltage threshold, $v_{th}$. Alternatively, ADC 40 may be implemented as a multi-bit ADC capable of providing higher precision regarding the specific voltage developed on sensing node 36, depending on the requirements of the system.

Comparator 82 subsequently compares the captured output state held in latch 42 with a value held in counter 38 that is selectively controlled by clock/control circuit 44. In response to the output generated by comparator 82, clock/control circuit 44 may selectively change the value held in counter 38 to be one of a higher value or a lower value, depending on the algorithm employed. Depending upon the implementation of counter 38 and comparator 82, clock/control circuit 44 may also selectively reset the value of counter 38 or comparator 82 or both. The digital field-strength value developed by counter 38 is available for any appropriate use, as discussed above.

In another embodiment, our invention may be adapted to sense the environment to which a tag is exposed, as well as sensing changes to that same environment. As disclosed in our Related References, the auto-tuning capability of tuner 16 acting in conjunction with tank circuit 14 detects antenna impedance changes. These impedance changes may be a function of environmental factors such as proximity to interfering substances, e.g., metals or liquids, as well as a function of a reader or receiver antenna orientation. Likewise, as disclosed herein, our field strength (i.e., received power) detector 20 may be used to detect changes in received power (i.e., field strength) as a function of, for example, power emitted by the reader, distance between tag and reader, physical characteristics of materials or elements in the immediate vicinity of the tag and reader, or the like. Sensing the environment or, at least, changes to the environment is accomplished using one or both of these capabilities.

Figure 11:
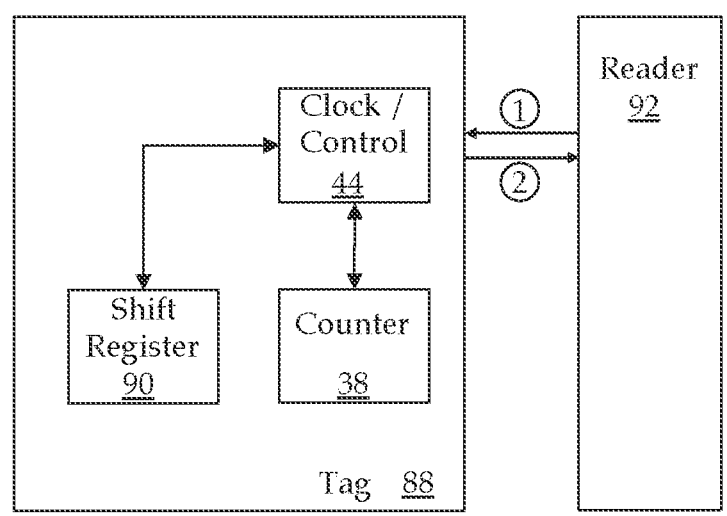
FIG. 11 illustrates, in block schematic form, an exemplary RFID sub-system containing tag and reader.

As an example, the tag 88 of FIG. 11, contains both a source tag antenna 12 (not shown, but see, e.g., FIG. 6) and a corresponding load chip tank circuit 14 (not shown, but see, e.g., FIG. 6). Each contains both resistive and reactive elements as discussed previously (see, e.g., FIG. 8). A tag 88 containing such a tank circuit 14 mounted on a metallic surface will exhibit antenna impedance that is dramatically different than the same tag 88 in free space or mounted on a container of liquid. Table 1 displays exemplary values for impedance variations in both antenna source resistance 74 as well as antenna source reactance 76 as a function of frequency as well as environmental effects at an exemplary frequency:

TABLE 1

| Antenna Impedance Variations | | | |
|---|---|---|---|
| In Free Air | 860 MHz | 910 MHz | 960 MHz |
| $R_s$ | 1.9 | 2.5 | 3.7 |
| $X_s$ | 124 | 136 | 149 |
| @910 MHz | Free Air | On Water | On Metal |
| $R_s$ | 2.5 | 26 | 1.9 |
| $X_s$ | 136 | 136 | 27 |

Figure 8:
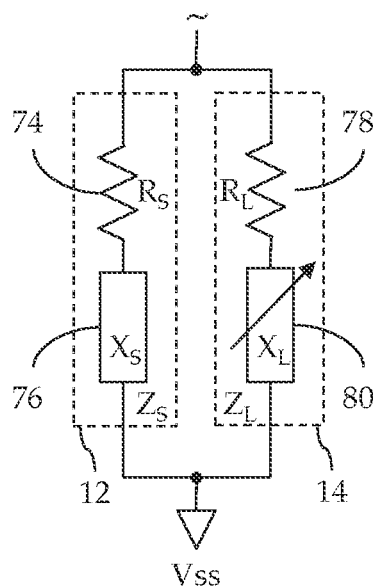
FIG. 8 illustrates, in block schematic form, an alternative representation of the impedance represented by the antenna and the tank circuit of the exemplary RFID receiver circuit.

The tuner circuit 16 of our invention as disclosed in the Related References automatically adjusts the load impendence by adjusting load reactance 80 (see, e.g., FIG. 8) to match source antenna impedance represented by source resistance 74 (see, e.g., FIG. 8) and source reactance 76 (see, e.g., FIG. 8). As previously disclosed, matching of the chip load impedance and antenna source impedance can be performed automatically in order to achieve maximum power transfer between the antenna and the chip. My invention as disclosed in the Related References contained a digital shift register 90 for selectively changing the value of the load reactive component, in the present case a variable capacitor, until power transfer is maximized. This digital value of the matched impendence may be used either internally by the tag 88, or read and used by the reader 92, to discern relative environmental information to which the tag 88 is exposed. For example, tag 88 may contain a calibrated look-up-table within the clock/control circuit 44 which may be accessed to determine the relevant environmental information. Likewise, a RFID reader 92 may issue commands (see transaction 1 in FIG. 11) to retrieve (see transaction 2 in FIG. 11) the values contained in digital shift register 90 via conventional means, and use that retrieved information to evaluate the environment to which tag 88 is exposed. The evaluation could be as simple as referencing fixed data in memory that has already been stored and calibrated, or as complex as a software application running on the reader or its connected systems for performing interpretive evaluations.

Likewise, consider a tag 88 containing our field strength (i.e., received power) detector 20 (not shown, but, e.g., see FIG. 6) wherein the method of operation of the system containing the tag 88 calls for our field strength detector 20 to selectively perform its sweep function and developing the quantized digital representation of the current via the method discussed earlier. As illustrated in FIG. 11, counter 38 will contain the digital representation developed by our field strength detector 20 of the RF signal induced current, and may be used either internally by the tag 88, or read and used by the reader 92, to discern relative environmental information to which the tag 88 is exposed. For example, reader 92 may issue a command to the tag 88 (see transaction 1 in FIG. 11) to activate tuner 16 and/or detector 20 and, subsequent to the respective operations of tuner 16 and/or detector 20, receive (see transaction 2 in FIG. 11) the digital representations of either the matched impedance or the maximum current developed during those operations. Once again, this digital value of the field strength stored in the counter 38 may be used either internally by the tag 88, or read and used by the reader 92, to discern relative environmental information to which the tag 88 is exposed. For example, tag 88 may contain a calibrated look-up-table within the clock and control block 44 which may be accessed to determine the relevant environmental information. Likewise, a RFID reader may issue commands to retrieve the values contained in digital shift register 90, and use that retrieved information to evaluate the environment to which tag 88 is exposed. The evaluation could be as simple as referencing fixed data in memory that has already been stored and calibrated, or as complex as a software application running on the reader or its connected systems for performing interpretive evaluations. Thus, the combining of the technologies enables a user to sense the environment to which a tag 88 is exposed as well as sense changes to that same environment.

Thus, it is apparent that we have provided an effective and efficient method and apparatus for quantizing the received RF field strength as a function of induced current. We have developed this field quantization in a form and manner that is suitable for selectively varying the impedance of the tank circuit to maximize received power, especially during normal system operation. Those skilled in the art will recognize that modifications and variations can be made without departing from the spirit of our invention. Therefore, we intend that our invention encompass all such variations and modifications as fall within the scope of the appended claims.

What is claimed is:

1. A method comprises:
   transmitting, by a radio frequency identification (RFID) reader, a series of RF signals to a plurality of RF receiver circuits in a time sequence, wherein a first RF signal of the series of RF signals is sent at a first time of the time sequence, and wherein the first RF signal commands the plurality of RF receiver circuits to remain silent when received signal strength of the first RF signal corresponds to a power level greater than a first power level;
   receiving, by the RFID reader, one or more sets of responses from one or more sets of RF receiver circuits of the plurality of RF receiver circuits in response to the series of RF signals, wherein a first set of responses of the one or more sets of responses is received from a first set of RF receiver circuits of the one or more sets of RF receiver circuits, wherein each RF receiver circuit of the first set of RF receiver circuits receives the first RF signal at a received signal strength corresponding to a power level lower than the first power level;
   determining, by the RFID reader, a space of interest based on the one or more sets of responses;
   determining, by the RFID reader, a set of power levels corresponding to the space of interest; and
   transmitting, by the RFID reader, a second series of RF signals to the plurality of RF receiver circuits in a second time sequence, wherein a first RF signal of the second series of RF signals is sent at a first time of the second time sequence, and wherein the first RF signal of the second series of RF signals commands the plurality of RF receiver circuits to remain silent when received signal strength of the first RF signal of the second series of RF signals corresponds to a power level greater than a first power level of the set of power levels.

2. The method of claim 1 further comprises:
receiving, by the RFID reader, one or more second sets of responses from one or more second sets of RF receiver circuits of the plurality of RF receiver circuits in response to the second series of RF signals, wherein a first set of responses of the one or more second sets of responses is received from a first set of RF receiver circuits of the one or more second sets of RF receiver circuits, wherein each RF receiver circuit of the first set of RF receiver circuits of the one or more second sets of RF receiver circuits receives the first RF signal of the second series of RF signals at a received signal strength corresponding to a power level lower than the first power level of the set of power levels;
determining, by the RFID reader, a second space of interest based on the one or more second sets of responses;
determining, by the RFID reader, a second set of power levels corresponding to the second space of interest; and
transmitting, by the RFID reader, a third series of RF signals to the plurality of RF receiver circuits in a third time sequence, wherein a first RF signal of the third series of RF signals is sent at a first time of the third time sequence, and wherein the first RF signal of the third series of RF signals commands the plurality of RF receiver circuits to remain silent when received signal strength of the first RF signal of the third series of RF signals corresponds to a power level greater than a first power level of the second set of power levels.

3. The method of claim 1 further comprises:
receiving, by a first RF receiver circuit of the plurality of RF receiver circuits, the series of RF signals;
determining, by the first RF receiver circuit, power levels for each RF signal of the series of RF signals; and
when the power level of one of the RF signals of the series of RF signals is lower than the first power level:
transmitting, by the first RF receiver circuit, a response to the first RF signal of the series of RF signals.

4. The method of claim 3 further comprises:
when the power level of the one of the RF signals is lower than a second power level:
transmitting, by the first RF receiver circuit, a response to a second RF signal of the series of RF signals, wherein the second RF signal commands the plurality of RF receiver circuits to remain silent when received signal strength of the first RF signal corresponds to a power level greater than the second power level.

5. The method of claim 1 further comprises:
determining, by the RFID reader, that the first set of RF receiver circuits are physically closer to the RFID reader than a second set of RF receiver circuits, wherein each RF receiver circuit of the second set of RF receiver circuits receives a second RF signal at a received signal strength corresponding to a power level lower than a second power level, wherein the first power level is less than the second power level.

6. The method of claim 1 further comprises:
adjusting, by the RFID reader, a degree of correspondence of the received signal strength of the first RF signal corresponding to the first power level such that the first set of RF receiver circuits includes a single RF receiver circuit.

7. The method of claim 1, wherein a response of the one or more sets of responses includes one or more of:
a received signal strength indication, an indication of an environmental condition, and an identifier of an RF receiver circuit.

8. The method of claim 1, wherein determining the space of interest comprises:
identifying, by the RFID reader, a set of core RF receiver circuits based on the one or more sets of responses.

9. A radio frequency identification (RFID) reader comprises:
a transmitter operable to transmit a series of RF signals to a plurality of RF receiver circuits in a time sequence, wherein a first RF signal of the series of RF signals is sent at a first time of the time sequence, and wherein the first RF signal commands the plurality of RF receiver circuits to remain silent when received signal strength of the first RF signal corresponds to a power level greater than a first power level;
a receiver operable to receive one or more sets of responses from one or more sets of RF receiver circuits of the plurality of RF receiver circuits in response to the series of RF signals, wherein a first set of responses of the one or more sets of responses is received from a first set of RF receiver circuits of the one or more sets of RF receiver circuits, wherein each RF receiver circuit of the first set of RF receiver circuits receives the first RF signal at a received signal strength corresponding to a power level lower than the first power level;
a control circuit operable to:
determine a space of interest based on the one or more sets of responses; and
determine a set of power levels corresponding to the space of interest; and
the transmitter is further operable to transmit a second series of RF signals to the plurality of RF receiver circuits in a second time sequence, wherein a first RF signal of the second series of RF signals is sent at a first time of the second time sequence, and wherein the first RF signal of the second series of RF signals commands the plurality of RF receiver circuits to remain silent when received signal strength of the first RF signal of the second series of RF signals corresponds to a power level greater than a first power level of the set of power levels.

10. The RFID reader of claim 9 further comprises:
the receiver is further operable to receive one or more second sets of responses from one or more second sets of RF receiver circuits of the plurality of RF receiver circuits in response to the second series of RF signals, wherein a first set of responses of the one or more second sets of responses is received from a first set of RF receiver circuits of the one or more second sets of RF receiver circuits, wherein each RF receiver circuit of the first set of RF receiver circuits of the one or more second sets of RF receiver circuits receives the first RF signal of the second series at a received signal strength corresponding to a power level lower than the first power level of the set of power levels;
the control circuit is further operable to:

determine a second space of interest based on the one or more second sets of responses;

determine a second set of power levels corresponding to the second space of interest; and the transmitter is further operable to transmit a third series of RF signals to the plurality of RF receiver circuits in a third time sequence, wherein a first RF signal of the third series of RF signals is sent at a first time of the third time sequence, and wherein the first RF signal of the third series of RF signals commands the plurality of RF receiver circuits to remain silent when received signal strength of the first RF signal of the third series corresponds to a power level greater than a first power level of the second set of power levels.

11. The RFID reader of claim 9, wherein the control circuit is further operable to:

determine that the first set of RF receiver circuits are physically closer to the RFID reader than a second set of RF receiver circuits, wherein each RF receiver circuit of the second set of RF receiver circuits receives a second RF signal at a received signal strength corresponding to a power level lower than a second power level, wherein the first power level is less than the second power level.

12. The RFID reader of claim 9, wherein the control circuit is further operable to:

adjust a degree of correspondence of the received signal strength of the first RF signal corresponding to the first power level such that the first set of RF receiver circuits includes a single RF receiver circuit.

13. The RFID reader of claim 9, wherein the control circuit is further operable to:

interpret a response of the one or more sets of responses as one or more of: a received signal strength indication, an indication of an environmental condition, and an identifier of an RF receiver circuit.

* * * * *